United States Patent [19]

Kobayashi et al.

[11] Patent Number: 5,023,698
[45] Date of Patent: Jun. 11, 1991

[54] SEMICONDUCTOR DEVICE

[75] Inventors: Shiro Kobayashi, Hitachi; Emiko Murofushi, Mito; Masahiko Itoh, Ohta, all of Japan

[73] Assignee: Hitachi, Ltd., Tokyo, Japan

[21] Appl. No.: 327,609

[22] Filed: Mar. 23, 1989

[30] Foreign Application Priority Data

Mar. 30, 1988 [JP] Japan .................................. 63-74658

[51] Int. Cl.$^5$ ...................... H01L 23/54; H01L 23/48
[52] U.S. Cl. ......................................... 357/67; 357/70
[58] Field of Search ........................ 357/67, 74, 70, 71

[56] References Cited

U.S. PATENT DOCUMENTS

| | | | |
|---|---|---|---|
| 4,704,626 | 11/1987 | Mahulikar et al. | 357/67 |
| 4,732,733 | 3/1988 | Sakamoto et al. | 357/67 |
| 4,750,029 | 6/1988 | Fatatsuka et al. | 357/67 |
| 4,805,009 | 2/1989 | Pryor et al. | 357/67 |

FOREIGN PATENT DOCUMENTS

| | | | |
|---|---|---|---|
| 0158509 | 10/1985 | European Pat. Off. | 357/67 |
| 0068663 | 5/1980 | Japan | 357/67 |
| 62-13058 | 1/1987 | Japan | 357/67 |

Primary Examiner—Rolf Hille
Assistant Examiner—S. V. Clark
Attorney, Agent, or Firm—Antonelli, Terry, Stout & Kraus

[57] ABSTRACT

A metallization film layer disposed on a semiconductor chip is made of Cu alloy which contains a metal element less noble than Cu and whose balance consists of Cu and unavoidable impurities. The metal element less noble than Cu is at least one kind of members selected from the group consisting of Al, Be, Cr, Fe, Mg, Ni, Si, Sn and Zn. Cu alloy as the metallization film layer improves corrosion resistance by adding a trance amount of a metal element less noble than Cu within such a range where electric conductivity is not much reduced to Cu without lowering high electric conductivity, high heat resistance and high electro-migration resistance of Cu.

2 Claims, 1 Drawing Sheet

SEMICONDUCTOR DEVICE

BACKGROUND OF THE INVENTION

The present invention relates to a semiconductor device and more particularly to a semiconductor device having high reliability and high speed responsibility.

The present invention relates to a semiconductor device wherein a metallization film layer constituting a logic circuit disposed on a semiconductor chip is made of an improved metallization material.

Pure Al or Al-Si type alloy has been used as a material for a metallization film layer constituting a logic circuit disposed on a semiconductor chip because the pure Al or Al-Si type alloy has high workability.

Miniaturization of a metallization film layer has advanced in recent years to provide higher integration density of the semiconductor chip and the formation of the metallization film layer; a metallization film layer with a thickness about 1 $\mu$m, and having a metallization line of below 1 $\mu$m are now necessary.

However, the reduction of the cross-sectional area of the metallization film layer disposed on the semiconductor chip has caused serious problems such as the drop of the response speed of the circuit of the semiconductor device due to the increase in a conducting delay time, the increase in an exothermic quantity of the semiconductor chip, the drop of the metallization life due to the progress of electro-migration with the increase in an electric current density on the semiconductor chip, and so forth.

Therefore, the metallization film layer material including the electrode portion material must have low electric resistance, high heat-resistance and high resistance to electro-migration. Furthermore, the metallization film layer material must be excellent in corrosion resistance, too, with the decrease in the film thickness of the metallization film layer.

However, the materials for conventional Al type metallization film layers including the materials for the electrode portion of the semiconductor device have high electric resistance and are not free from the problems with respect to heat resistance and electro-migration resistance.

To avoid these problems, Japanese Patent Laid-Open No. 294838/1986 describes a Cu type metallization film layer material for the semiconductor device having higher electric conductivity, higher heat resistance and higher electro-migration resistance than Al type metallization film layer material.

In other words, the electric resistance of Cu is about $\frac{2}{3}$ of that of Al and the melting point (1083° C.) of Cu is 400° C. or more higher than that (660° C.) of Al. Moreover, the conducting life of Cu material due to the progress of electro-migration is incomparably higher than the conducting life of the Al material.

Accordingly, if a semiconductor device is fabricated by use of Cu material for the metallization film layer disposed on the semiconductor chip, high speed responsivity and high reliability of the semiconductor device can be improved.

However, Cu is not free from the problems of oxidation resistance and corrosion resistance. Since the protective property of oxidation by an oxide film such as CuO and Cu$_2$O formed on the surface of Cu is lower than that of Al, Cu is more susceptible to high temperature oxidation and is more easily corroded in an oxidizing solution such as nitro-hydrofluoric acid mixture.

The metallization film layer material disposed on the semiconductor chip for the semiconductor device must have high corrosion resistance because it is exposed to high temperature gas atmosphere and to an oxidizing aqueous solution environment such a nitro-hydrofluoric acid mixture in the fabrication process of the semiconductor device and is subjected to a moisture reliability test under high temperature and high humidity conditions.

It is therefore an important technical problem to improve the corrosion resistance of the metallization film layer material for the semiconductor device while satisfying its need for high electric conductivity, heat resistance and electro-migration resistance.

SUMMARY OF THE INVENTION

An object of the present invention is to provide a semiconductor device wherein high speed responsivity in electric conductivity for a metallization film layer disposed on a semiconductor chip can be obtained.

Another object of the present invention is to provide a semiconductor device wherein high reliability in heat resistance, electrode-migration and corrosion resistance for a metallization film layer disposed on a semiconductor chip can be obtained.

Speaking broadly, the present invention relates to a semiconductor device and is characterized by use of Cu alloy which contains a metal element less noble than Cu and whose balance consists of Cu and unavoidable impurities as the material of a metallization film layer inside a semiconductor chip.

In other words, the present invention is characterized in that Cu alloy which improves corrosion resistance by adding a trace amount of a metal element less noble than Cu within such a range where electric conductivity is not much reduced from Cu, without lowering high electric conductivity, high heat resistance and high electro-migration resistance of Cu, is used as the material of the metallization film layer.

A semiconductor device having high speed responsibility and high reliability can be provided by use of this metallization film layer material disposed on the semiconductor chip.

Next, how high speed responsivity and high reliability of the semiconductor device can improved by use of Cu alloy containing a trace amount of a less noble metal element than Cu for the metallization film layer will be explained as follows.

The conducting delay time of a signal flowing through the metallization film layer inside the semiconductor chip is an important factor that determines high speed responsibility of the semiconductor device and its value is proportional to the electric resistance of the metallization film layer. Therefore, the conducting delay time is proportional to the length of the metallization film layer and its specific resistance and is inversely proportional to the metallization line of the metallization film layer.

To reduce the drop of the conducting delay time due to the reduction of the metallization line resulting from a higher integration density of the semiconductor chip, a metallization film layer material having a lower specific resistance must be used. Cu is an advantageous material because its specific resistance is 1.7 $\mu\Omega$cm which is by far lower than that of Al, i.e. 2.7 $\mu\Omega$cm. The melting point of Cu is by about 400° C. higher than that of Al and is more advantageous in the aspect of heat resistance, too.

Furthermore, as to the lamination defect energy which is a factor in determining electro-migration resistance, Cu has a value of 40 erg/cm$^2$ which is lower than 200 erg/cm$^2$ for Al. Though Cu has more excellent properties than Al as the metallization film layer material as described above, it involves the problem in corrosion resistance.

Cu is oxidized by several μm per hour in the atmosphere of 400° to 500° C. under the annealing condition after the formation of the metallization film layer, whereas Al is oxidized by only several hundreds of angstroms. In an aqueous solution environment, Cu and Al have almost equivalent corrosion resistance in a neutral solution but in an oxidizing solution such as nitro-hydrofluoric acid mixture, Cu is more likely to be corroded than Al.

Corrosion resistance of a metal depends on the protective property of the oxide film formed on the metal surface and whereas the oxide film consisting principally of Al$_2$O$_3$ which is formed on Al surface is extremely stable, CuO or Cu$_2$O formed on the surface of Cu has low protective property under the oxidizing environment.

Various corrosion-resistance Cu alloys have been developed to improve corrosion resistance of Cu, but since an alloy element or alloy elements are added in high concentration such as several percentages in the alloy or all these alloys, high electric conductivity of Cu drops remarkably and specific resistance of Cu becomes higher than that of Al.

It can be understood from the description given above, it is effective to add a trace amount of a corrosion resistance improving metal element in order to improve corrosion resistance of Cu without lowering its excellent properties.

Metal elements less noble than Cu are effective as the addition metal element. When Cu to which a less noble metal element is added is exposed to corrosive environment, Cu is not oxidized but the addition less noble metal element is selectively oxidized and its oxide film is formed on the surface of the metallization film layer. This oxide film serves as the protection thin film and restricts corrosion of Cu as a substrate or base layer.

Examples of the addition metal elements include Al, Be, Cr, Fe, Mg, Ni, Si, Sn and Zn it is preferred to add at least one kind of metal element selected from the group described above.

When Al is added to Cu, Al is selectively oxidized under corrosive environment and Al$_2$O$_3$ formed on the surface acts to limit corrosion of Cu. The amount of addition for Al is preferably from 0.01 to 0.5wt %. If the addition amount for Al is below this range, the effect of addition is not observed and if it is above this range, electric conductivity becomes lower than that of Al. When added to Cu, Al causes solid solution and exhibits reinforcement so that mechanical strength is increased and electro-migration resistance can be improved.

Each metal element of Be, Cr, Fe, Mg, Ni, Si, Sn and Zn is selectively oxidized when added to Cu, in the same way as Al, and the protection oxide film consisting principally of each of BeO, Cr$_2$O$_3$, Fe$_2$O$_3$+Fe$_3$O$_4$, MgO, Ni$_2$O$_3$+Ni$_3$O$_4$, SiO$_2$, SnO$_2$ and ZnO is formed and improves corrosion resistance. A suitable amount of addition for each metal element stated above is within such a range where electric conductivity is not dropped remarkably.

A preferable range of each metal element is 0.01 to 0.2% for Be, 0.01 to 0.3% for Cr, 0.01 to 0.2% for Fe, 0.01 to 0.3% for Mg, 0.01 to 0.5% for Ni, 0.01 to 0.5% for Si, 0.01 to 0.5% for Sn and 0.01 to 2% for Zn, in terms of weight ratio.

The lower limit value of the addition amount of metal element corresponds to the lowest concentration for improving corrosion resistance and electro-migration resistance and besides, the upper limit value of the addition amount of metal element corresponds to the maximum allowable amount at which specific resistance of Cu alloy does not exceed that of Al. The relation between the specific resistance of Cu alloy and its addition mount varies with each metal element added.

Among the addition metal elements, Be, Cr and Fe cause precipitation reinforcement when added to Cu while Si, Sn and Zn cause solid solution reinforcement. In either case, mechanical strength is increased and electro-migration resistance is improved.

Among the addition metal elements, Zn and Ni provide a remarkable effect in improving corrosion resistance and particularly, Zn is advantageous because the greatest allowable addition amount is high. Further, Al provides an effect that corrosion resistance can be improved under high temperature environment such as above 400° C. at the condition of annealing after the formation of the metallization film layer.

Cu alloy to which at least one kind of the metal elements described above is added is excellent in heat resistance, electro-migration resistance and corrosion resistance and has electric conductivity almost equivalent to that of pure Cu. A semiconductor device having by use of this Cu alloy as the metallization film layer material inside the semiconductor chip.

According to present invention, high speed responsibility and high reliability as a semiconductor device by use of a metallization film layer material can be obtained, namely which is excellent in electric conductivity, heat resistance, electro-migration resistance and corrosion resistance even when a miniature metallization film layer having a metallization line of 1 μm or below is formed.

DESCRIPTION OF THE PRESENT INVENTION

Figure 1:
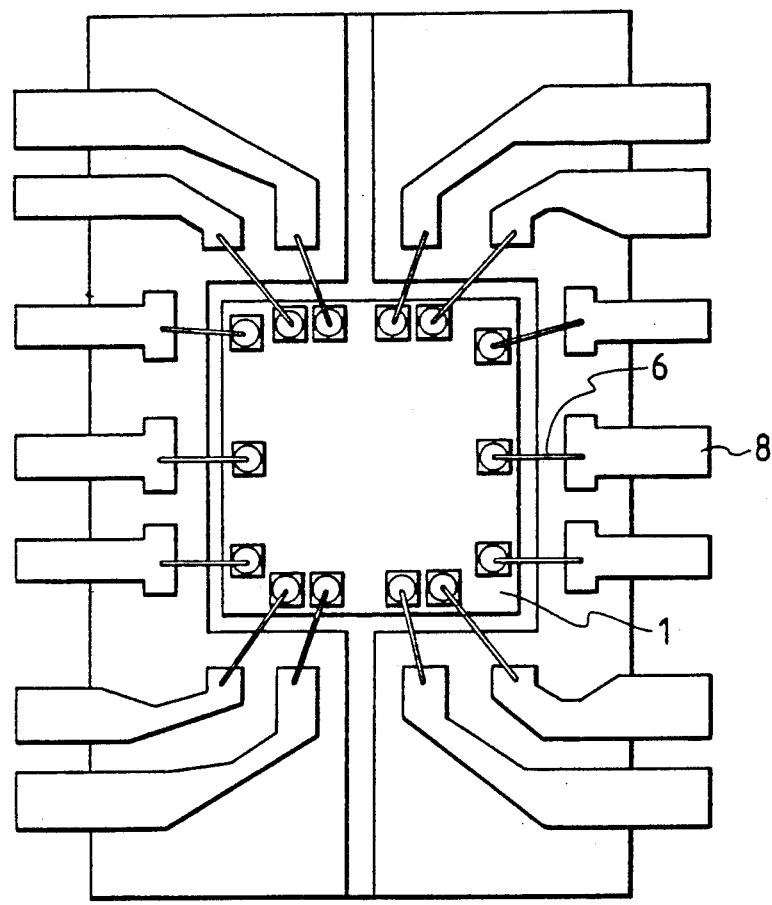
FIG. 1 is a plan view showing one embodiment of a semiconductor device according to the present invention.

One embodiment of a semiconductor device according to the present invention will be explained referring to the drawings.

Figure 2:
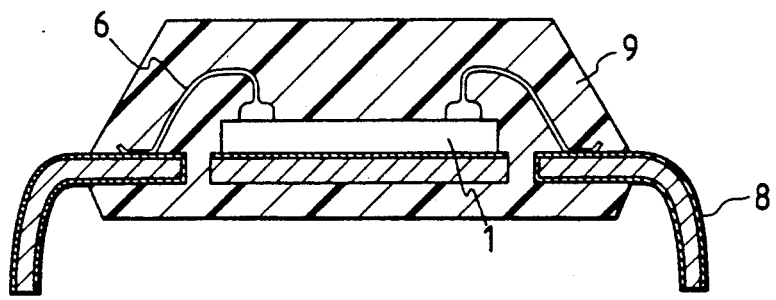
FIG. 2 is a sectional view showing one embodiment of a semiconductor device according to the present invention.

FIGS. 1 and 2 show one embodiment of a semiconductor device according to the present invention. In FIGS. 1 and 2, a semiconductor device comprises mainly a substrate constituting a Si semiconductor chip, and an Au wire 6 connected to Si semiconductor chip 1, a Cu lead frame 8 connected to Au wire 6, and a resin or ceramic packaging material 9 encapsulated to Si semiconductor chip 1, Au wire 6, and Cu lead frame 8.

Figure 3:
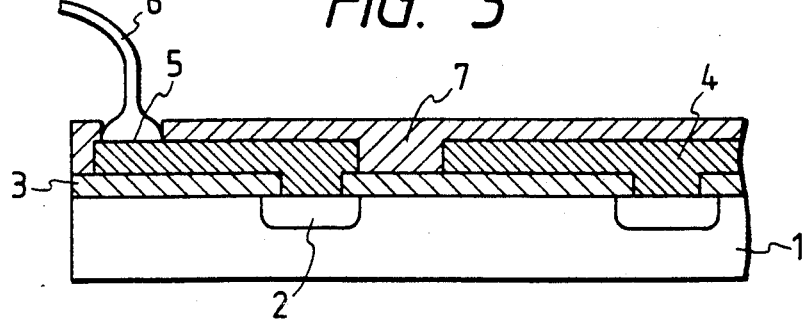
FIG. 3 is a sectional view showing an essential portion of one embodiment of a semiconductor device according to the present invention.

FIG. 3 is a sectional view showing an essential portion of the semiconductor device according to the present invention.

In FIG. 3, the semiconductor device of the present invention comprises further a diffusion layer 2 disposed in Si semiconductor chip 1 and to which an impurity such as P, As or the like doped, an insulator film layer 3 disposed on a surface of Si semiconductor chip 1 and be made of $SiO_2$ for which a window is opened, a metallization film layer 4 disposed on a surface of the insulator film layer 3 and being formed by sputtering of Cu alloy containing a trace metal element, an electrode portion 5 of the metallization film layer 4 and being formed by sputtering of Cu alloy containing a trace metal element, Au wire 6 bonded to the electrode portion 5, and a protection film layer (passivation film) 7 consisting of PSG (phospho-silicate glass).

Hereinafter, the present invention will be explained more concretely with reference to its embodiments but the present invention is not particularly limited thereto.

Table 1 represents the result of characteristic tests of the semiconductor chip of the semiconductor device by forming the metallization film layer having various compositions by sputtering by use of a 0.8 μm mask pattern for 4 mega DRAM on Si semiconductor chip.

High speed responsivity of the semiconductor chip was evaluated by measuring the time between the input and output of a signal pulse, that is, the conducting delay time.

A high temperature wiring breakage ratio was measured as electro-migration resistance after the lapse of 500 hours at a high temperature current test causing a current of $10^6$ A/cm$^2$ to flow through the wiring at 180° C.

On the other hand, moisture resistance reliability of the semiconductor chip was evaluated by a PCT (pressure cooker test) left-standing wiring breakage ratio after the lapse of 250 hours by a PCT (pressure cooker test) test where each sample was left standing at 120° C. and 95% RH (relative humidity).

TABLE 1

|  | No. | circuit wiring composition | delay time (n sec) | high temperature power wiring breakage ratio (%) | PCT left-standing wiring breakage ratio (%) |
|---|---|---|---|---|---|
| Embodiments of Present Invention | 1 | Cu-0.1 Al | 31 | <1 | 33 |
|  | 2 | Cu-0.1 Be | 31 | <1 | 34 |
|  | 3 | Cu-0.1 Cr | 31 | <1 | 33 |
|  | 4 | Cu-0.1 Fe | 31 | <1 | 33 |
|  | 5 | Cu-0.1 Mg | 31 | <1 | 34 |
|  | 6 | Cu-0.1 Ni | 30 | <1 | 32 |
|  | 7 | Cu-0.1 Si | 31 | <1 | 34 |
|  | 8 | Cu-0.1 Sn | 30 | <1 | 32 |
|  | 9 | Cu-0.1 Zn | 29 | <1 | 33 |
| Comparative Examples | 10 | Cu | 29 | 1 | 45 |
|  | 11 | Al | 38 | 45 | 35 |
|  | 12 | Al—Si | 39 | 42 | 33 |

As can be understood from Table 1, the semiconductor chips using the metallization film layer materials in accordance with various embodiments of the present invention have high speed responsivity and electro-migration resistance almost equivalent to those of the semiconductor chips using Cu metallization film layer material and more excellent than the semiconductor chip using Al type metallization film layer material.

On the other hand, moisture resistance reliability of the semiconductor chip is drastically improved in comparison with Comparative Example using Cu metallization film layer material, and is almost equivalent to that of the semiconductor chip using Al type metallization film layer material.

As described above, it is possible to provide a semiconductor device having high speed responsivity and high reliability by use of Cu alloy metallization film layer having the composition in accordance with various embodiments of the present invention.

When Cu alloy is used for the metallization film layer disposed on the semiconductor chip as described above, there can be obtained the semiconductor device having higher corrosion resistance, higher electro-migration resistance and higher speed responsivity than when Al type metallization film layer material is used.

We claim:

1. A semiconductor device comprising a semiconductor chip, a diffusion layer formed on said semiconductor chip, an insulator film layer formed on said semiconductor chip, a metallization film layer formed on said semiconductor chip, an electrode portion formed on said metallization form layer, a protection film layer formed on said metallization film layer, a wire connected to said electrode portion, a lead frame connected to said wire, and package covering said semiconductor chip, said protection film layer and said wire, characterized in that
said metallization film layer is made of Cu alloy which contains a metal element less noble than Cu and the balance of which consists of Cu and unavoidable impurities; said metal element less noble than Cu is at least one element selected from the group consisting of Al, Be, Cr, Fe, Mg, Ni, Si, Sn and Zn and the content of said metal element less noble than Cu in a weight ratio is 0.01 to 0.5% of Al, 0.01 to 0.3% of Be, 0.01 to 0.3% of Cr, 0.01 to 0.2% of Fe, 0.01 to 0.3% of Mg, 0.01 to 0.5% of Ni, 0.01 to 0.2% of Si, 0.01 to 0.5% of Sn and 0.01 to 2% of Zn; said film layer exhibiting high electrical conductivity, high heat resistance, high electro-migration resistance and high corrosion resistance.

2. A semiconductor device comprising a Si semiconductor chip, a diffusion layer formed on said Si semiconductor chip, an insulator film layer formed on said Si semiconductor chip, a metallization film layer formed on said Si semiconductor chip, an electrode portion formed on said metallization film layer, a protection film layer formed on said metallization film layer, and an Au film connected to said electrode portion, a Cu lead frame connected to said Au wire, and a resin or ceramic package covering said Si semiconductor chip, said protection film layer and said Au wire, characterized in that said metallization film layer is made of Cu alloy which contains a metal element less noble than Cu and the balance of which consists of Cu and unavoidable impurities, said metal element less noble than Cu is at least one element selected from the group consisting of Al, Be, Cr, Fe, Mg, Ni, Si, Sn and Zn and the content of said metal element less noble than Cu in a weight ratio is 0.01 to 0.5% of Al, 0.01 to 0.3% of Be, 0.01 to 0.3% of Cr, 0.01 to 0.2% of Fe, 0.01 to 0.3% of Mg, 0.01 to 0.5% of Ni, 0.01 to 0.2% of Si, 0.01 to 0.5% of Sn and 0.01 to 2% of Zn; said film layer exhibiting high electrical conductivity, high heat resistance, high electromigration resistance and high corrosion resistance.

* * * * *